(12) United States Patent
Koshikawa

(10) Patent No.: US 11,094,368 B2
(45) Date of Patent: Aug. 17, 2021

(54) MEMORY, MEMORY CHIP AND MEMORY DATA ACCESS METHOD

(71) Applicant: Powerchip Semiconductor Manufacturing Corporation, Hsinchu (TW)

(72) Inventor: Yasuji Koshikawa, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/779,677

(22) Filed: Feb. 3, 2020

(65) Prior Publication Data

US 2021/0050047 A1    Feb. 18, 2021

Related U.S. Application Data

(60) Provisional application No. 62/886,973, filed on Aug. 15, 2019.

(51) Int. Cl.
*G11C 7/06* (2006.01)
*G11C 11/4091* (2006.01)
(Continued)

(52) U.S. Cl.
CPC ........ *G11C 11/4091* (2013.01); *G06F 3/0604* (2013.01); *G06F 3/0659* (2013.01);
(Continued)

(58) Field of Classification Search
CPC . G11C 7/1072; G11C 11/408; G11C 11/4096; G11C 13/0004; G11C 13/0061; G11C 13/0069; G11C 2207/2254; G11C 2211/5642; G11C 2211/5647; G11C 29/52; G11C 7/10; G11C 7/1012; G11C 7/1051; G11C 7/1057; G11C 7/106; G11C 7/222; G11C 7/1048; G11C 11/4076;
(Continued)

(56) References Cited

U.S. PATENT DOCUMENTS

| 7,808,848 B2 | 10/2010 | Shibata et al. |
| 10,002,108 B2 | 6/2018 | Herrero Abellanas et al. |
| 2015/0003172 A1* | 1/2015 | Kim ................. G11C 11/40626 365/189.05 |

FOREIGN PATENT DOCUMENTS

| CN | 108256641 | 7/2018 |
| TW | I576838 | 4/2017 |
| TW | 201913659 | 4/2019 |

OTHER PUBLICATIONS

"Office Action of Taiwan Counterpart Application", dated Sep. 25, 2020, pp. 1-5.

* cited by examiner

*Primary Examiner* — Thong Q Le
(74) *Attorney, Agent, or Firm* — JCIPRNET

(57) ABSTRACT

A memory, a memory chip and a memory data access method are provided. The memory of the disclosure includes a plurality of memory chips. Each of the plurality of memory chips includes a first bank group, a second bank group and a read amplifier and a write amplifier. The first bank group includes a plurality of first memory banks. The second bank group includes a plurality of second memory banks. The read amplifier and the write amplifier are separately coupled to the first bank group and the second bank group. The read amplifier and the write amplifier are configured to independently access different bank groups.

18 Claims, 8 Drawing Sheets

(51) Int. Cl.
*G06F 13/16* (2006.01)
*G11C 11/4096* (2006.01)
*G06F 3/06* (2006.01)

(52) U.S. Cl.
CPC ............ *G06F 3/0679* (2013.01); *G06F 13/16* (2013.01); *G11C 11/4096* (2013.01)

(58) Field of Classification Search
CPC ............ G11C 11/4093; G11C 13/0038; G11C 11/4074; G11C 11/4087; G11C 13/0026; G11C 13/0028; G11C 13/004; G11C 16/08; G11C 16/10; H01L 2224/48091; H01L 2924/00014; H01L 2224/16225; H01L 2224/48227; H01L 2224/4824; H01L 2924/15311
USPC ...................... 365/163, 194; 711/105, 154, 5
See application file for complete search history.

MEMORY, MEMORY CHIP AND MEMORY DATA ACCESS METHOD

CROSS-REFERENCE TO RELATED APPLICATION

This application claims the priority benefit of U.S. provisional application Ser. No. 62/886,973, filed on Aug. 15, 2019. The entirety of the above-mentioned patent application is hereby incorporated by reference herein and made a part of this specification.

BACKGROUND

Technical Field

The disclosure generally relates to memory data access techniques, in particular, to a memory, a memory chip and a memory data access method.

Description of Related Art

In the general memory architecture, each of a plurality of memory chips of a memory only includes one memory bank group having a plurality of memory banks, where the each of the memory chips further includes one read amplifier and one write amplifier. That is, the each of the memory chips has to separately perform a reading operation and a writing operation at different times. In other words, if one of the memory chips has a reading requirement and a writing requirement at same time, the one of the memory chips has to execute one of the reading operation and the writing operation, and then execute another one of the reading operation and the writing operation after the previous operation is completed. Thus, the memory data access efficiency of the memory of the general memory architecture is low and prone to memory data access conflicts. Therefore, regarding how to make the memory to reach a good data access efficiency and reduce memory data access conflicts, solutions of several embodiments are provided below.

SUMMARY

The disclosure is directed to a memory, a memory chip and a memory data access method, and are capable of providing better memory data access efficiency.

The memory of the disclosure includes a plurality of memory chips. Each of the plurality of memory chips includes a first bank group, a second bank group and a read amplifier and a write amplifier. The first bank group includes a plurality of first memory banks. The second bank group includes a plurality of second memory banks. The read amplifier and the write amplifier are separately coupled to the first bank group and the second bank group, and configured to independently access different bank groups.

In an embodiment of the disclosure, the read amplifier of each the plurality of memory chips is coupled to a first input/output bus through a first sub-input/output bus. A bandwidth of the first input/output bus is greater than a bandwidth of the first sub-input/output bus, so that at least part of the read amplifiers of the plurality of memory chips simultaneously transmit data through the first input/output bus.

In an embodiment of the disclosure, the bandwidth of the first input/output bus is equal to a sum of the bandwidths of the first sub-input/output buses coupled the read amplifiers of the plurality of memory chips.

In an embodiment of the disclosure, the write amplifier of each the plurality of memory chips is coupled to a second input/output bus through a second sub-input/output bus. A bandwidth of the second input/output bus is greater than a bandwidth of the second sub-input/output bus, so that at least part of the write amplifiers of the plurality of memory chips simultaneously receive data through the second input/output bus.

In an embodiment of the disclosure, the bandwidth of the second input/output bus is equal to a sum of the bandwidths of the second sub-input/output buses coupled the write amplifiers of the plurality of memory chips.

In an embodiment of the disclosure, one of memory chips receives a read start command to start a reading operation, and the read amplifier of the one of memory chips reads first data from one of the first bank group and the second bank group during a reading period of the reading operation. The one of memory chips successively receives a write start command during the reading period to start a writing operation, and the write amplifier of the one of memory chips writes second data into the one of the first bank group and the second bank group during a writing period of the writing operation, where the reading period and the writing period are partially overlapped.

In an embodiment of the disclosure, each of the plurality of first memory banks and the plurality of second memory banks is a memory array. The memory array includes a plurality of sub-memory arrays. The plurality of sub-memory arrays are coupled to the read amplifier and the write amplifier through a global data line. When the read amplifier reads the first data of one of the plurality of sub-memory arrays from the global data line according the read start command during the read period, and the write amplifier previously receive the second data to start the write period. After read amplifier finishes receiving the first data from the global data line during the read period, the write amplifier successively transmits the second data to the global data line for writing into same or different sub-memory arrays during the write period.

In an embodiment of the disclosure, each of the plurality of memory chips includes a selector. The selector is coupled to the read amplifier through a first internal input/output bus, coupled to the write amplifier through a second internal input/output bus, and coupled to a shared input/output bus through a sub-shared input/output bus. The selector is configured to select to access the first bank group or the second bank group through the read amplifier and the write amplifier.

In an embodiment of the disclosure, a bandwidth of the sub-shared input/output bus is greater than or equal to a sum of bandwidths of the first internal input/output bus and the second internal input/output bus, so that the read amplifier and the write amplifier simultaneously access different memory banks.

In an embodiment of the disclosure, a bandwidth of the shared input/output bus is equal to a sum of bandwidths of two sub-shared input/output buses.

The memory chip of the disclosure includes a first bank group, a second bank group and a read amplifier and a write amplifier. The first bank group includes a plurality of first memory banks. The second bank group includes a plurality of second memory banks. The read amplifier and the write amplifier are separately coupled to the first bank group and the second bank group, and configured to independently access different bank groups.

The memory data access method adapted to a memory chip of the disclosure. The memory chip includes a first bank group, a second bank group, a read amplifier and a write amplifier. The read amplifier and the write amplifier are configured to independently access different bank groups. The data access method includes the following steps. A read start command is received by the memory chip to start a reading operation. First data is read by the read amplifier from one of the first bank group and the second bank group during a reading period of the reading operation. During the reading period, a write start command is successively received by the memory chip to start a writing operation. Second data is written by the write amplifier into the one of the first bank group and the second bank group during a writing period of the writing operation, where the reading period and the writing period are partially overlapped.

Based on the above, according to the memory, the memory chip and the memory data access method of the disclosure, the memory chip of the memory is capable of performing a reading operation and a writing operation on different memory bank groups at the same time, therefore the memory chip and the memory are capable of providing better memory data access efficiency.

In order to make the aforementioned features and advantages of the present disclosure more comprehensible, embodiments accompanied with accompanying drawings are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
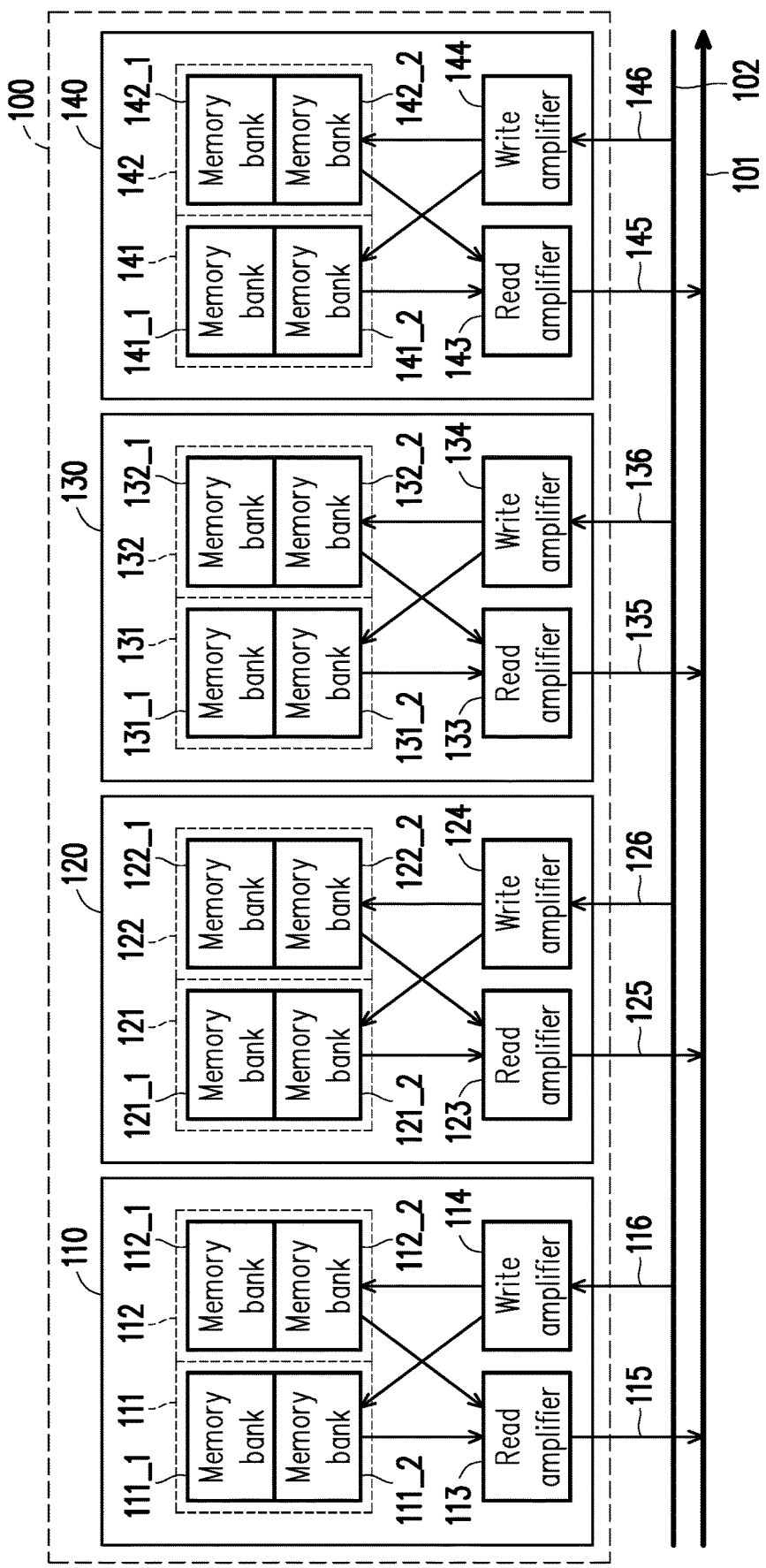
FIG. 1 is a schematic architecture diagram of a memory according to an embodiment of the disclosure.

In order to make the contents of the disclosure easier to understand, the following embodiments are listed as examples, that may exactly be implemented accordingly, of the disclosure. In addition, elements/components/steps marked with the same sign numbers in the drawings and implementation modes represent the same or similar parts if possible.

FIG. 1 is a schematic architecture diagram of a memory according to an embodiment of the disclosure. Referring to FIG. 1, the memory 100 includes memory chips 110, 120, 130 and 140, and the plurality of memory chips 110, 120, 130 and 140 are coupled to other circuits or modules outside the memory 100, such as a center processor unit (CPU), an image signal processor (ISP) core, a digital signal processor (DSP) core, a graphics processing unit (GPU) core, a convolutional neural network (CNN) accelerator or the other modules having a memory access requirement of a large amounts of data, through two input/output buses 101 and 102. In the embodiment of the disclosure, the memory 100 may be a dynamic random-access memory (DRAM), but the disclosure is not limited thereto. In the embodiment of the disclosure, the memory chips 110, 120, 130 and 140 include first memory bank groups 111, 121, 131 and 141 and second memory bank groups 112, 122, 132 and 142, where each of the memory chips 110, 120, 130 and 140 includes one first memory bank group and one second memory bank group. In other words, one memory array of each of the memory chips 110, 120, 130 and 140 may be divided to form two different memory bank groups, and each of the two different memory bank groups further include one or more memory bank.

In the embodiment of the disclosure, the first memory bank groups 111, 121, 131 and 141 and the second memory bank groups 112, 122, 132 and 142 include first memory banks 111_1, 112_1, 121_1, 122_1, 131_1, 132_1, 141_1 and 142_1 and second memory banks 111_2, 112_2, 121_2, 122_2, 131_2, 132_2, 141_2 and 142_2, where one memory bank group includes one first memory bank and one second memory bank. For example, a memory capacity of each of the memory chips 110, 120, 130 and 140 is 1 Gigabyte (Gb), where a memory width of one memory bank is 128 Kilobyte (Kb) and a memory depth of the one memory bank is 2 Kilobyte. In the embodiment of the disclosure, the memory chips 110, 120, 130 and 140 further include read amplifiers 113, 123, 133 and 143 and write amplifiers 114, 124, 134 and 144, where the each of the memory chips 110, 120, 130 and 140 includes one read amplifier and one write amplifier. Each of the read amplifiers 113, 123, 133 and 143 is coupled to respective two memory bank groups in the each of the memory chips 110, 120, 130 and 140, and each of the write amplifiers 114, 124, 134 and 144 is also coupled to the respective two memory bank groups in the each of the memory chips 110, 120, 130 and 140. The read amplifiers 113, 123, 133 and 143 are coupled to the input/output bus 101 through sub-input/output buses 115, 125, 135 and 145 respectively. The write amplifiers 114, 124, 134 and 144 are coupled to the input/output bus 102 through sub-input/output buses 116, 126, 136 and 146 respectively. However, the number of memory chips and the number of memory banks of the memory 100 of the disclosure are not limited thereto.

In the embodiment of the disclosure, a bandwidth of the input/output bus 101 may be greater than or equal to a sum of bandwidths of the sub-input/output buses 115, 125, 135 and 145. For example, the bandwidth of the input/output bus 101 may be 2 kilobytes, and each of the bandwidths of the sub-input/output buses 115, 125, 135 and 145 may be 512 bytes. Thus, the memory chips 110, 120, 130 and 140 share the input/output bus 101, so that the read operations of at least part of the memory chips 110, 120, 130 and 140 can be independently performed at the same time, where the at least part of the memory chips 110, 120, 130 and 140 can simultaneously transmit data through the sub-input/output buses 115, 125, 135 and 145 to the input/output bus 101. In the embodiment of the disclosure, a bandwidth of the input/output bus 102 may be greater than or equal to a sum of bandwidths of the sub-input/output buses 116, 126, 136 and 146. For example, the bandwidth of the input/output bus 102 may be 2 kilobytes, and each of the bandwidths of the sub-input/output buses 116, 126, 136 and 146 may be 512 bytes. Thus, the memory chips 110, 120, 130 and 140 share the input/output bus 102, so that the write operations of at least part of the memory chips 110, 120, 130 and 140 can be independently performed at the same time, where the memory chips 110, 120, 130 and 140 can simultaneously receive data through the sub-input/output buses 116, 126, 136 and 146 to the input/output bus 102.

In the embodiment of the disclosure, taking the memory chip 110 as an example, owing to the read amplifier 113 and the write amplifier 114 are separately coupled to the bank groups 111 and 112, the read amplifier 113 and the write amplifier 114 are capable of independently accessing different bank groups 111 and 112. That is, the read amplifier 113 may read data from one of the bank groups 111 and 112, and the write amplifier 114 may write data into another one of the bank groups 111 and 112 at the same time. In other words, the memory chips 110, 120, 130 and 140 of the memory 100 are capable of performing at least one of the read operations and the write operations on the different bank groups at the same time. The memory chips 110, 120, 130 and 140 are no need to wait for each other's access operation, so as to save the times of waiting for access. Therefore, the memory 100 of the disclosure is capable of providing fast and efficient memory data access efficiency to meet the memory access requirement of the large amounts of data.

Figure 2:
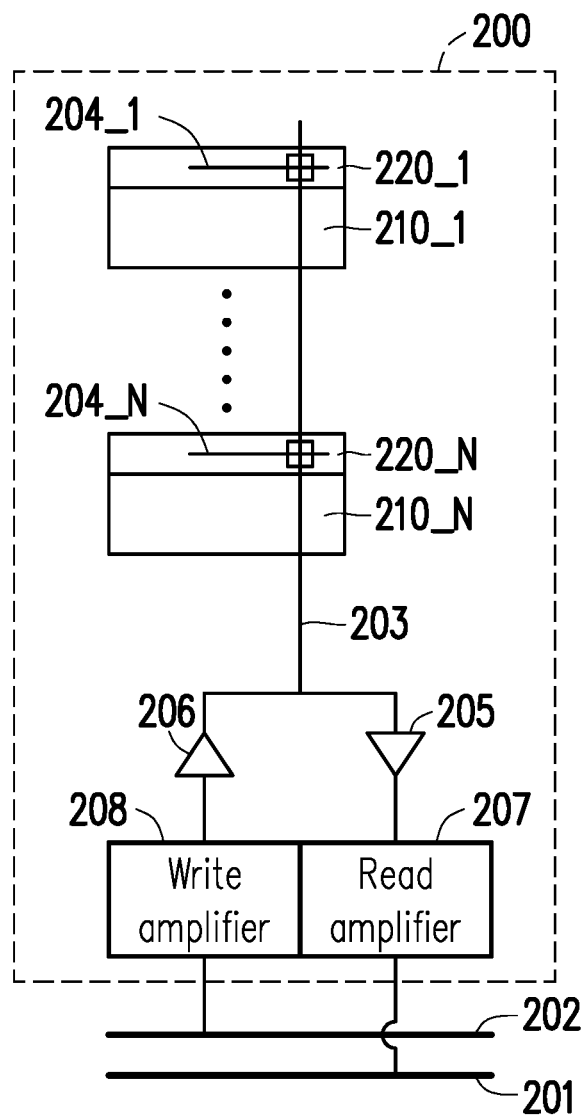
FIG. 2 is a schematic architecture diagram of a memory chip according to an embodiment of the disclosure.

FIG. 2 is a schematic architecture diagram of a memory chip according to an embodiment of the disclosure. Referring to FIG. 2, a memory chip 200 can be applied to the memory chip of each embodiment of the disclosure. The memory chip 200 includes a plurality of sub-memory arrays 210_1 to 210_N, where N is a positive integer greater than 1, and the sub-memory arrays 210_1 to 210_N belong to one memory bank group. Further, the sub-memory arrays 210_1 to 210_N may be respectively corresponded to two memory banks, such as the above first memory bank and the above second memory bank. The memory chip 200 further includes a plurality of sense amplifiers 220_1 to 220_N corresponding to the sub-memory arrays 210_1 to 210_N. In the embodiment of the disclosure, a read amplifier 207 and a write amplifier 208 of the memory chip 200 are separately coupled to a global data line 203 through global data line amplifiers 205 and 206 respectively, and the global data line 203 is further coupled to the sense amplifiers 220_1 to 220_N. The read amplifier 207 and the write amplifier 208 are first input first output (FIFO) channels. The sense amplifiers 220_1 to 220_N respectively access the sub-memory arrays 210_1 to 210_N, and transmit data to the global data line 203 through a plurality of local data line 204_1 to 204_N. In the embodiment of the disclosure, the read amplifier 207 is further coupled to an input/output bus 201 to transmit data read by any one of the sub-memory arrays 210_1 to 210_N to the outside, and the write amplifier 208 is further coupled to an input/output bus 202 to receive data from outside for writing into any one of the sub-memory arrays 210_1 to 210_N.

Figure 3:
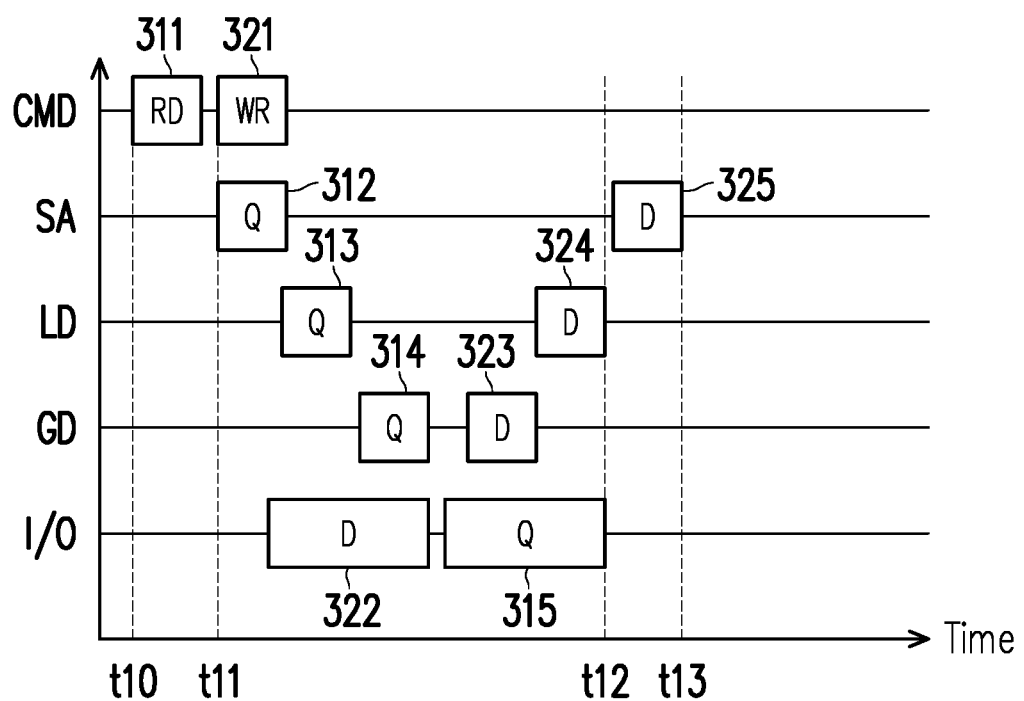
FIG. 3 is an operation timing diagram of accessing the same memory bank group according to an embodiment of the disclosure.

FIG. 3 is an operation timing diagram of accessing the same memory bank group according to an embodiment of the disclosure. Referring to FIG. 2 and FIG. 3, the operation timing diagram of FIG. 3 can be applied to the memory chip 200, and this embodiment takes accessing the sub-memory array 210_1 (the same memory bank group) as an example. In the embodiment of the disclosure, as shown by a time sequence CMD in FIG. 3, the memory chip 200 receives a read start command (RD) to start a reading operation during the period 311, and then the memory chip 200 receives a write start command (WR) to start a writing operation during the period 321, where a reading period of the reading operation and a writing period of the writing operation are partially overlapped. The reading period is between the time point t10 to the time point t12. The writing period is between the time point t1 to the time point t13. In the embodiment of the disclosure, after the memory chip 200 receives the read start command (RD) and starts the reading operation during the period 311, as shown by the time sequence SA in FIG. 3, the sense amplifier 220_1 reads data (Q) from the sub-memory array 210_1 during the period 312. Then, as shown by the time sequence LD in FIG. 3, the data (Q) is transmitted by the local data line 204_1 during the period 313. Then again, as shown by the time sequence GD in FIG. 3, the data (Q) is transmitted by the global data line 203 during the period 314. Finally, as shown by the time sequence I/O in FIG. 3, the global data line amplifier 205 and the read amplifier 207 receive the data (Q) from the global data line 203, and provide the data (Q) to the input/output bus 201.

In the embodiment of the disclosure, the memory chip 200 can receive the write start command (WR) during the period 321 (after the read start command (RD)). For example, the memory chip 200 receives the write start command (WR) when the sense amplifier 220_1 reads data (Q) from the sub-memory array 2101. Thus, as shown by the time sequence I/O in FIG. 3, the global data line amplifier 206 and the write amplifier 208 receive the data (D) from the input/output bus 202 during the period 322 and provide the data (D) to the global data line 203. Then, as shown by the time sequence GD in FIG. 3, the data (D) is transmitted by the global data line 203 during the period 323. It should be noted that, as shown by the time sequence GD in FIG. 3, owing to the global data line 203 first outputs the data (D) and then inputs the data (Q), the global data line 203 has no memory data access conflicts. Then again, as shown by the time sequence LD in FIG. 3, the data (D) is transmitted by the local data line 204_1 during the period 324. Finally, as shown by the time sequence SA in FIG. 3, the sense amplifier 220_1 writes the data (D) into the sub-memory array 210_1 through the sub-memory array 210_1 during the period 325. Therefore, there is also no memory data access conflicts in the local data line 204_1 and the sense amplifier 220_1. Further, owing to the reading period of the reading operation and the writing period of the writing operation are partially overlapped, the memory chip 200 is capable of providing fast and efficient data access efficiency. In addition, in other embodiments of the disclosure, the operation timing diagram of FIG. 3 can also be applied to another access case of performing the reading operation and the writing operation on different sub-memory arrays in the same memory bank group of the memory chip 200.

Figure 4:
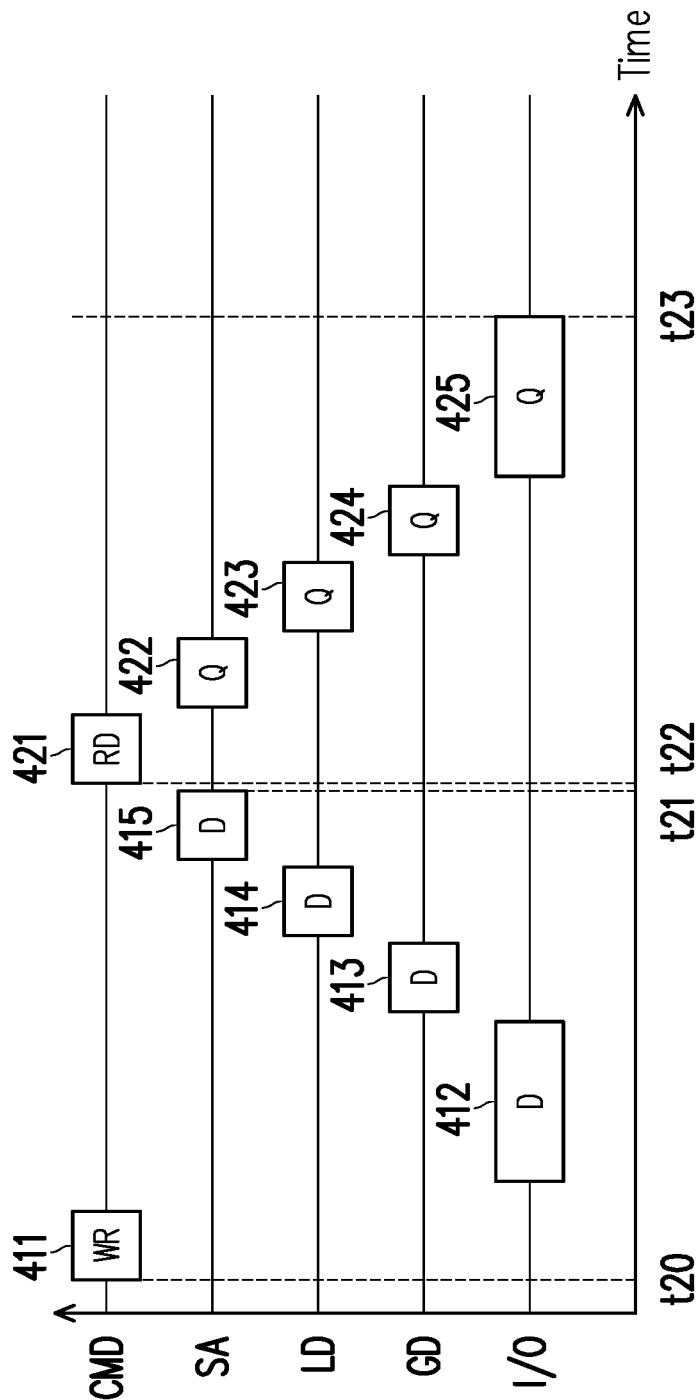
FIG. 4 is an operation timing diagram of accessing the same memory bank group according to another embodiment of the disclosure.

FIG. 4 is an operation timing diagram of accessing the same memory bank group according to another embodiment of the disclosure. FIG. 4 is an operation timing diagram of accessing the same memory bank group according to an embodiment of the disclosure. Referring to FIG. 2 and FIG. 4, the operation timing diagram of FIG. 4 can be applied to the memory chip 200, and this embodiment takes accessing the sub-memory array 210_1 (the same memory bank group) as an example. In the embodiment of the disclosure, as shown by the time sequence CMD in FIG. 4, the memory chip 200 receives a write start command (WR) to start a writing operation during the period 411, and then the memory chip 200 receives a read start command (RD) to start a reading operation during the period 421, where a reading period of the reading operation and a writing period of the writing operation do not overlap. The writing period is between the time point t20 to the time point t21. The reading period is between the time point t22 to the time point t23. In the embodiment of the disclosure, after the memory chip 200 receives the write start command (WR) and starts the writing operation during the period 411, as shown by the time sequence I/O in FIG. 4, the global data line amplifier 206 and the write amplifier 208 receive the data (D) from the input/output bus 202 during the period 412 and provide the data (D) to the global data line 203. Then, as shown by the time sequence GD in FIG. 4, the data (D) is transmitted by the global data line 203 during the period 413. Then again, as shown by the time sequence LD in FIG. 4, the data (D) is transmitted by the local data line 204_1 during the period 414. Finally, as shown by the time sequence SA in FIG. 4, the sense amplifier 220_1 writes the data (D) into the sub-memory array 210_1 during the period 415.

In the embodiment of the disclosure, in order to avoid the sense amplifier 220_1, the local data line 204_1 and the global data line amplifier 205 occur data access conflicts, if the writing operation is executed before the read operation, the read operation should wait for the reading operation to finish before executing. Thus, as shown by the time sequence SA in FIG. 4, the sense amplifier 220_1 reads data (Q) from the sub-memory array 210_1 through the sub-memory array 210_1 during the period 422. Then, as shown by the time sequence LD in FIG. 4, the data (Q) is transmitted by the local data line 2041 during the period 423. Then again, as shown by the time sequence GD in FIG. 4, the data (Q) is transmitted by the global data line 203 during the period 424. Finally, as shown by the time sequence I/O in FIG. 4, the global data line amplifier 205 and the read amplifier 207 receive the data (Q) from the global data line 203 during the period 425, and provide the data (Q) to the input/output bus 201. In addition, in other embodiments of the disclosure, the operation timing diagram of FIG. 4 can also be applied to another access case of performing the reading operation and the writing operation on different sub-memory arrays in the same memory bank group of the memory chip 200.

Figure 5:
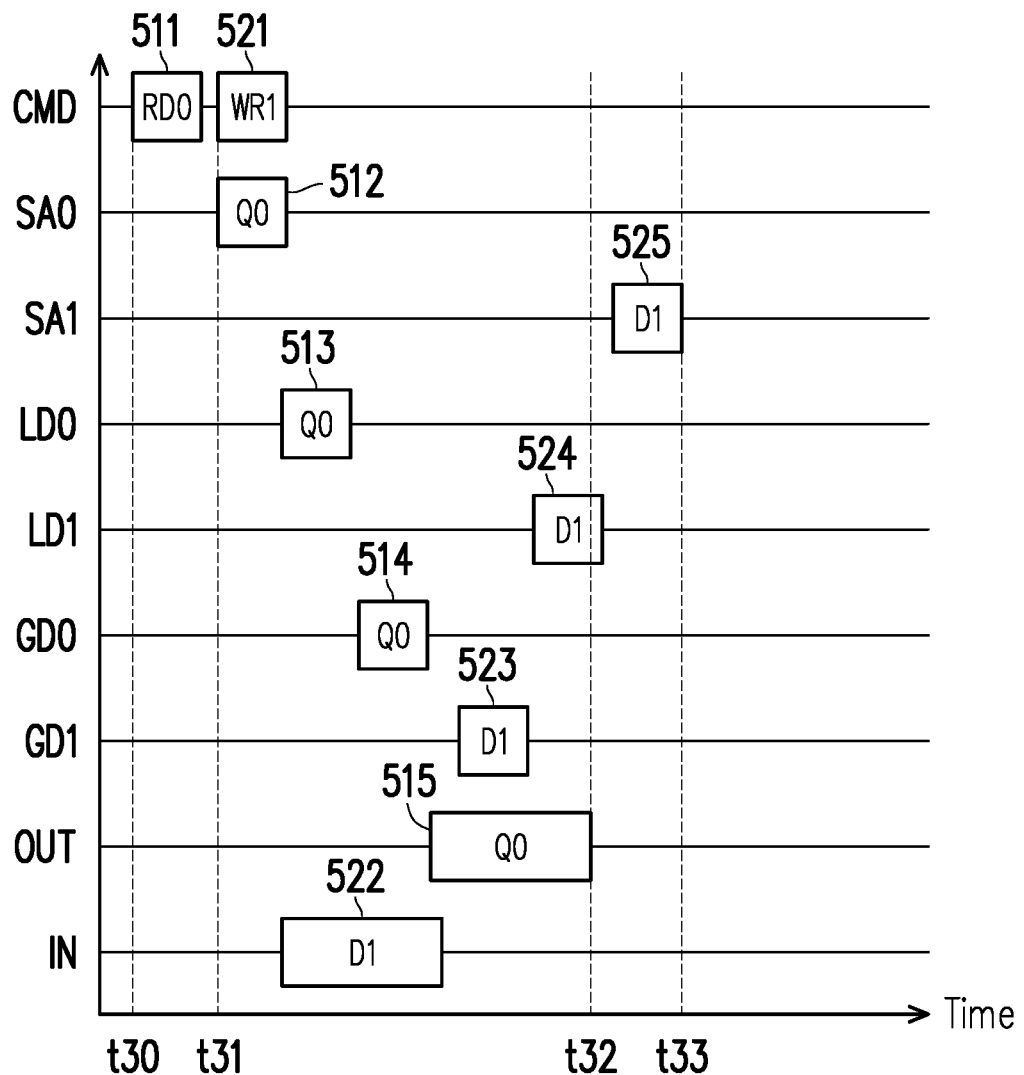
FIG. 5 is an operation timing diagram of accessing the different memory bank groups according to an embodiment of the disclosure.

FIG. 5 is an operation timing diagram of accessing the different memory bank groups according to an embodiment of the disclosure. Referring to FIG. 2 and FIG. 5, the operation timing diagram of FIG. 5 can be applied to the memory chip 200, and this embodiment takes accessing different sub-memory arrays of different memory bank groups as an example. In the embodiment of the disclosure, the memory chip 200 of FIG. 2 may further include another memory bank group (not shown), and the read amplifier 207 and the write amplifier 208 may be additionally coupled to another sub-memory array of the another memory bank group.

In the embodiment of the disclosure, the memory chip 200 accesses the sub-memory array 210_1 and another sub-memory array belonging to a different memory bank group. Thus, as shown by the time sequence CMD in FIG. 5, the memory chip 200 receives a read start command (RD0) to start a reading operation during the period 511, and then the memory chip 200 receives a write start command (WRI) to start a writing operation during the period 521, where a reading period of the reading operation and a writing period of the writing operation are partially overlapped. The reading period is between the time point t30 to the time point t32. The writing period is between the time point t31 to the time point t33. In the embodiment of the disclosure, after the memory chip 200 receives the read start command (RD) and starts the reading operation during the period 511, as shown by the time sequence SA0 in FIG. 5, the sense amplifier 220_1 reads data (Q0) from the sub-memory array 210_1 through the sub-memory array 210_1 during the period 512. Then, as shown by the time sequence LD0 in FIG. 5, the data (Q0) is transmitted by the local data line 204_1 during the period 513. Then again, as shown by the time sequence GD0 in FIG. 5, the data (Q0) is transmitted by the global data line 203 during the period 514. Finally, as shown by the time sequence OUT in FIG. 5, the global data line amplifier 205 and the read amplifier 207 receive the data (Q0) from the global data line 203, and provide the data (Q0) to the input/output bus 201.

In the embodiment of the disclosure, the memory chip 200 can receive the write start command (WRI) during the period 521 (after the read start command (RD0)). For example, the memory chip 200 receives the write start command (WRI) when the sense amplifier 220_1 reads data (Q0) from the sub-memory array 210_1. Thus, as shown by the time sequence IN in FIG. 5, another global data line amplifier and the write amplifier 208 receive the data (D1) from the input/output bus 202 during the period 522 and provide the data (D1) to another global data line (not shown). Then, as shown by the time sequence GD1 in FIG. 5, the data (D1) is transmitted by the another global data line during the period 523. Then again, as shown by the time sequence LD1 in FIG. 5, the data (D1) is transmitted by another local data line (not shown) during the period 524. Finally, as shown by the time sequence SA1 in FIG. 5, another sense amplifier (not shown) writes the data (D1) into the another sub-memory array belonging to the different memory bank group during the period 325. It should be noted that, owing to the read amplifier 207 and the write amplifier 208 are configured to access two different sub-memory arrays belonging to two different memory bank groups by different global data line amplifiers, different global data line, different local data line and different sense amplifier, the memory chip 200 has no memory data access conflicts in this data access case of the embodiment, and is capable of providing fast and efficient data access efficiency.

Figure 6:
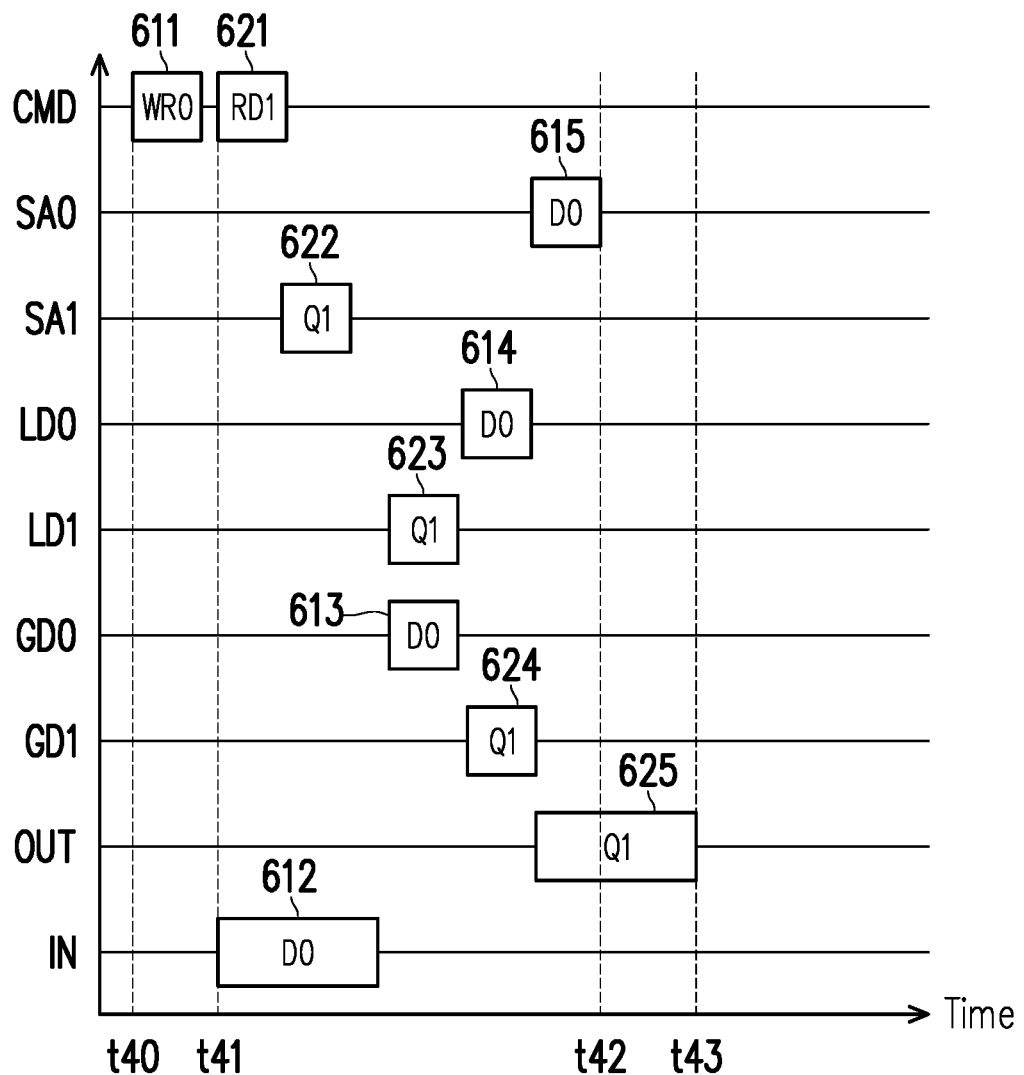
FIG. 6 is an operation timing diagram of accessing the different memory bank groups according to another embodiment of the disclosure.

FIG. 6 is an operation timing diagram of accessing the different memory bank groups according to another embodiment of the disclosure. Referring to FIG. 2 and FIG. 6, the operation timing diagram of FIG. 6 can be applied to the memory chip 200, and this embodiment takes accessing different sub-memory arrays of different memory bank groups as an example. In the embodiment of the disclosure, the memory chip 200 of FIG. 2 may further include another memory bank group (not shown), and the read amplifier 207 and the write amplifier 208 may be additionally coupled to another sub-memory array of the another memory bank group.

In the embodiment of the disclosure, the memory chip 200 accesses the sub-memory array 210_1 and another sub-memory array belonging to a different memory bank group. Thus, as shown by the time sequence CMD in FIG. 6, the memory chip 200 receives a write start command (WR0) to start a writing operation during the period 611, and then the memory chip 200 receives a read start command (RD1) to start a reading operation during the period 621, where a reading period of the reading operation and a writing period of the writing operation are partially overlapped. The writing period is between the time point t40 to the time point t42. The reading period is between the time point t41 to the time point t43. In the embodiment of the disclosure, after the memory chip 200 receives the write start command (WR0) and starts the writing operation during the period 611, as shown by the time sequence IN in FIG. 6, the global data line amplifier 206 and the write amplifier 208 receive the data (D0) from the input/output bus 202 during the period 612 and provide the data (D0) to the global data line 203. Then, as shown by the time sequence GD0 in FIG. 6, the data (D0) is transmitted by the global data line 203 during the period 613. Then again, as shown by the time sequence LD0 in FIG. 6, the data (D0) is transmitted by the local data line 204_1 during the period 614. Finally, as shown by the time sequence SA0 in FIG. 6, the sense amplifier 220_1 writes the data (D0) into the sub-memory array 210_1 through the sub-memory array 210_1 during the period 615.

In the embodiment of the disclosure, the memory chip 200 can receive the read start command (RD1) during the period 621 (after the write start command (WR0)). For example, the memory chip 200 receives the read start command (RD1) when the global data line amplifier 206 and the write amplifier 208 receive the data (D0) from the input/output bus 202. Thus, as shown by the time sequence SA1 in FIG. 6, another sense amplifier (not shown) reads data (Q1) from the another sub-memory array belonging to a different memory bank group during the period 622. Then, as shown by the time sequence LD1 in FIG. 6, the data (Q1) is transmitted by another local data line (not shown) during the period 623. Then again, as shown by the time sequence GD1 in FIG. 6, the data (Q1) is transmitted by another global data line (not shown) during the period 624. Finally, as shown by the time sequence OUT in FIG. 6, another global data line amplifier and the read amplifier 207 receive the data (Q1) from the another global data line during the period 625, and provide the data (Q1) to the input/output bus 201. It should be noted that, owing to the read amplifier 207 and the write amplifier 208 are configured to access two different sub-memory arrays belonging to two different memory bank groups by different global data line amplifiers, different global data line, different local data line and different sense amplifier, the memory chip 200 has no memory data access conflicts in this data access case of the embodiment, and is capable of providing fast and efficient data access efficiency.

Figure 7:
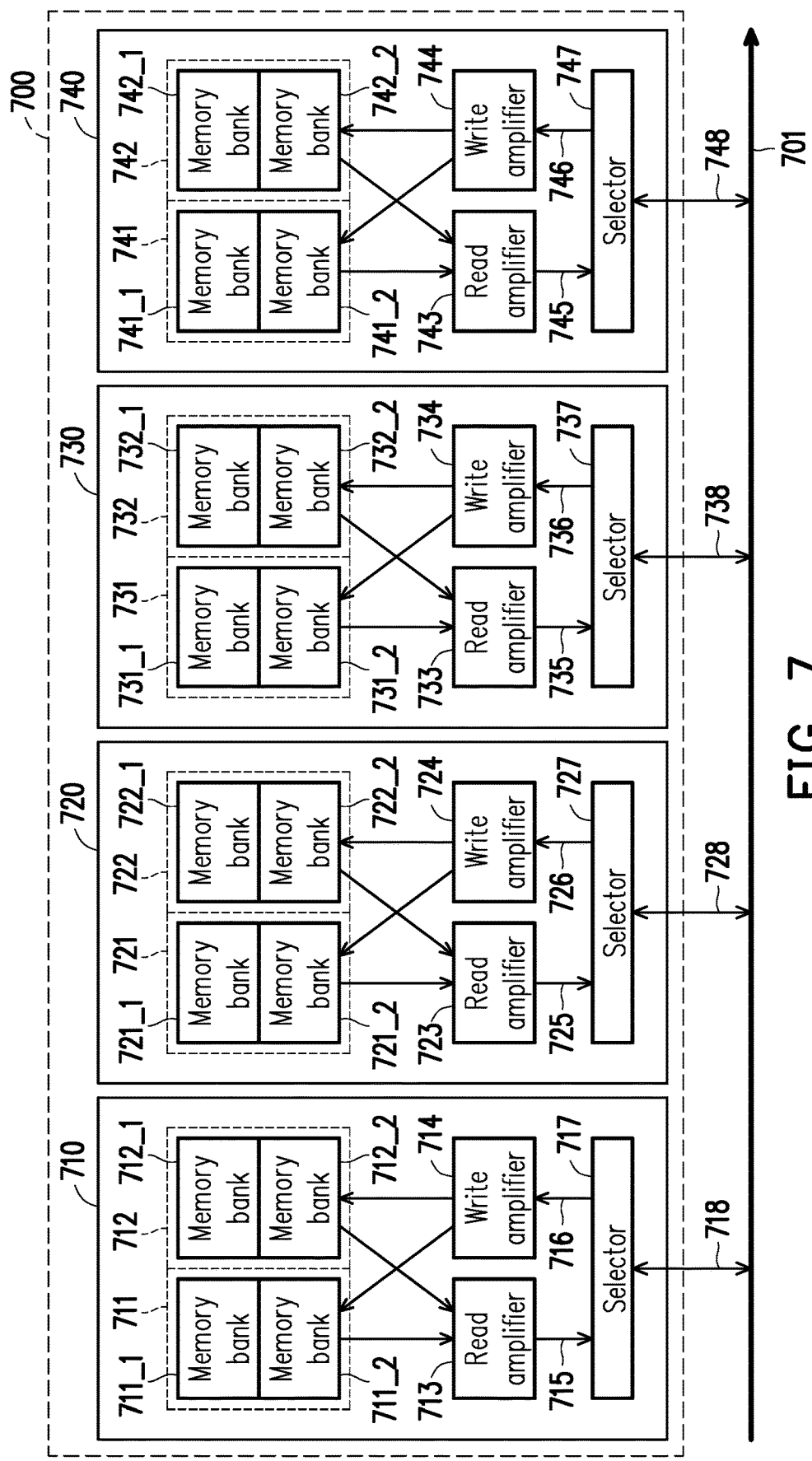
FIG. 7 is a schematic architecture diagram of a memory according to another embodiment of the disclosure.

FIG. 7 is a schematic architecture diagram of a memory according to another embodiment of the disclosure. The memory 700 includes memory chips 710, 720, 730 and 740, and the plurality of memory chips 710, 720, 730 and 740 are coupled to other circuits or modules outside the memory 700. In the embodiment of the disclosure, the memory chips 710, 720, 730 and 740 include first memory bank groups 711, 721, 731 and 741 and second memory bank groups 712, 722, 732 and 742, where each of the memory chips 710, 720, 730 and 740 includes one first memory bank group and one second memory bank group. In the embodiment of the disclosure, the first memory bank groups 711, 721, 731 and 741 and the second memory bank groups 712, 722, 732 and 742 include first memory banks 711_1, 712_1, 721_1, 722_1, 731_1, 732_1, 741_1 and 742_1 and second memory banks 711_2, 712_2, 721_2, 722_2, 731_2, 732_2, 741_2 and 742_2, where one memory bank group includes one first memory bank and one second memory bank. The memory chips 710, 720, 730 and 740 further include read amplifiers 713, 723, 733 and 743 and write amplifiers 714, 724, 734 and 744, where the each of the memory chips 710, 720, 730 and 740 includes one read amplifier and one write amplifier. Comparing with the above embodiment of FIG. 1, the memory chips 710, 720, 730 and 740 further include selectors 717, 727, 737 and 747, where the each of memory chips 710, 720, 730 and 740 includes one selector. In the embodiment of the disclosure, each of the read amplifiers 713, 723, 733 and 743 is coupled to respective two memory bank groups in the each of the memory chips 710, 720, 730 and 740, and each of the write amplifiers 714, 724, 734 and 744 is also coupled to the respective two memory bank groups in the each of the memory chips 710, 720, 730 and 740.

In the embodiment of the disclosure, the read amplifiers 713, 723, 733 and 743 are coupled to the selectors 717, 727, 737 and 747 through internal input/output buses 715, 725, 735 and 745 respectively. The write amplifiers 714, 724, 734 and 744 are coupled to the selectors 717, 727, 737 and 747 through internal input/output buses 716, 726, 736 and 746 respectively. The selectors 717, 727, 737 and 747 are coupled to the shared input/output bus 701 through sub-shared input/output buses 718, 728, 738 and 748. In the embodiment of the disclosure, the selectors 717, 727, 737 and 747 are configured to respectively select to access the respective first bank group or the respective second bank group through the respective read amplifier or and the respective write amplifier according a respective memory address. However, the number of memory chips and the number of memory banks of the memory of the disclosure are not limited thereto.

In the embodiment of the disclosure, a bandwidth of the shared input/output bus 701 may be greater than or equal to a sum of bandwidths of any two of the sub-shared input/output buses 718, 728, 738 and 748. The sub-shared input/output bus 718 may be greater than or equal to a sum of bandwidths of the internal input/output buses 715 and 716. The sub-shared input/output bus 728 may be greater than or equal to a sum of bandwidths of the internal input/output buses 725 and 726. The sub-shared input/output bus 738 may be greater than or equal to a sum of bandwidths of the internal input/output buses 735 and 736. The sub-shared input/output bus 748 may be greater than or equal to a sum of bandwidths of the internal input/output buses 745 and 746. For example, the bandwidth of the shared input/output bus 701 may be 2 kilobytes, and each of the bandwidths of the sub-shared input/output buses 718, 728, 738 and 748 may be 1 kilobyte. Each of the bandwidths of the internal input/output buses 715, 725, 735 and 745 and internal input/output buses 716, 726, 736 and 746 may be 512 bytes. Therefore, at least one of the read operations or the write operations of at least part of the memory chips 710, 720, 730 and 740 can be independently performed at the same time, where the at least part of the memory chips 710, 720, 730 and 740 can simultaneously transmit data through the sub-shared input/output buses 718, 728, 738 and 748 to the shared input/output bus 701 and simultaneously receive data through the sub-shared input/output buses 718, 728, 738 and 748 from the shared input/output bus 701.

In the embodiment of the disclosure, taking the memory chip 710 as an example, owing to the read amplifier 713 and the write amplifier 714 are separately coupled to the bank group 711 and 712, the read amplifier 713 and the write amplifier 714 are capable of independently accessing different bank groups 711 and 712. That is, the read amplifier 713 may be selected by the selector 717 to read data from one of the bank groups 711 and 712 according a memory address, and the write amplifier 714 may be selected by the selector 717 to write data into another one of the bank groups 711 and 712 according another memory address at the same time. In other words, the memory chips 710, 720, 730 and 740 of the memory 700 are capable of performing at least one of the read operations and the write operations on the different bank groups at the same time. The memory chips 710, 720, 730 and 740 are no need to wait for each other's access operation to save time waiting for access. Therefore, the memory 700 of the disclosure is capable of providing fast and efficient memory data access efficiency to meet the memory access requirement of the large amounts of data, and further reducing the number of the input/output bus coupled to the outside. It should be noted that, the operation timing diagrams of FIGS. 3-6 can also be applied to the memory chip 700, and enough teachings and recommendations for implementation contents and technical features of operation timing diagrams of FIGS. 3-6 applied to the memory chip 700 may be learned from related descriptions of the embodiments of FIG. 1 to FIG. 6, and details thereof are not repeated.

Figure 8:
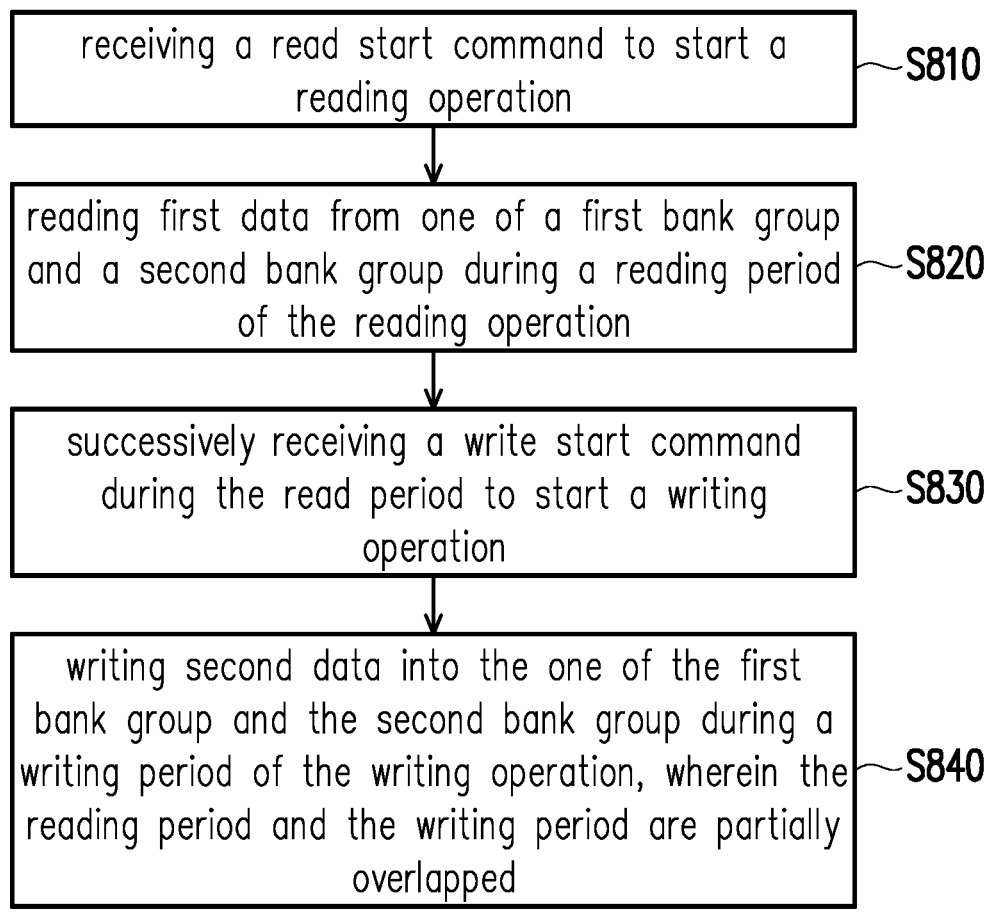
FIG. 8 is a flowchart of a memory data access method according to an embodiment of the disclosure.

FIG. 8 is a flowchart of a memory data access method according to an embodiment of the disclosure. Referring to FIG. 1 and FIG. 8, the memory data access method of FIG. 8 may be at least adapted to any one of memory chips 110, 120, 130 and 140 of the memory 100 of FIG. 1, and the following description takes memory chip 110 as an example. In step S810, the memory chip 110 receives a read start command to start a reading operation. In step S820, the read amplifier 113 reads first data from one of the first bank group 111 and the second bank group 112 during a reading period of the reading operation. In step S830, the memory chip 110 successively receives a write start command during the read period to start a writing operation. In step S840, the write amplifier 114 writes second data into the one of the first bank group 111 and the second bank group 112 during a writing period of the writing operation, where the reading period and the writing period are partially overlapped. Therefore, owing to the reading period of the reading operation and the writing period of the writing operation are partially overlapped, the memory data access method of FIG. 8 is capable of making any one of memory chips 110, 120, 130 and 140 in the memory 100 to provide fast and efficient data access efficiency.

In addition, enough teachings and recommendations for other memory features, implementation details and technical features of the memory 100 of the embodiment may be learned from related descriptions of the embodiments of FIG. 1 to FIG. 7, and details thereof are not repeated.

In summary, in the memory, the memory chip and the memory data access method thereof according to the disclosure, the memory chip of the memory is capable of performing a reading operation and a writing operation on different memory bank groups at the same time. Moreover, if the reading operation is previously executed before the writing operation on same memory bank group, a reading period of the reading operation and a writing period of the writing operation can partially overlap. Therefore, the memory chip and the memory of the disclosure are capable of providing better memory data access efficiency, and avoid memory data access conflicts.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory, comprising a plurality of memory chips, wherein each of the plurality of memory chips comprises:
a first bank group, comprising a plurality of first memory banks;
a second bank group, comprising a plurality of second memory banks; and
a read amplifier and a write amplifier, separately coupled to the first bank group and the second bank group, and configured to independently access different bank groups,
wherein one of the memory chips receives a read start command to start a reading operation, and the read amplifier of the one of the memory chips reads first data from one of the first bank group and the second bank group during a reading period of the reading operation,
wherein the one of the memory chips successively receives a write start command during the reading period to start a writing operation, and the write amplifier of the one of the memory chips writes second data into the one of the first bank group and the second bank group during a writing period of the writing operation, wherein the reading period and the writing period are partially overlapped.

2. The memory according to claim 1, wherein the read amplifier of each the plurality of memory chips is coupled to a first input/output bus through a first sub-input/output bus, and a bandwidth of the first input/output bus is greater than a bandwidth of the first sub-input/output bus, so that at least part of the read amplifiers of the plurality of memory chips simultaneously transmit data through the first input/output bus.

3. The memory according to claim 2, wherein the bandwidth of the first input/output bus is equal to a sum of the bandwidths of the first sub-input/output buses coupled the read amplifiers of the plurality of memory chips.

4. The memory according to claim 1, wherein the write amplifier of each the plurality of memory chips is coupled to a second input/output bus through a second sub-input/output bus, and a bandwidth of the second input/output bus is greater than a bandwidth of the second sub-input/output bus, so that at least part of the write amplifiers of the plurality of memory chips simultaneously receive data through the second input/output bus.

5. The memory according to claim 4, wherein the bandwidth of the second input/output bus is equal to a sum of the bandwidths of the second sub-input/output buses coupled the write amplifiers of the plurality of memory chips.

6. The memory according to claim 1, wherein each of the plurality of first memory banks and the plurality of second memory banks is a memory array, and the memory array comprises:
a plurality of sub-memory arrays, coupled to the read amplifier and the write amplifier through a global data line,
wherein when the read amplifier reads the first data of one of the plurality of sub-memory arrays from the global data line according the read start command during the read period, and the write amplifier previously receive the second data to start the write period,
wherein after read amplifier finishes receiving the first data from the global data line during the read period, the write amplifier successively transmits the second data to the global data line for writing into same or different sub-memory arrays during the write period.

7. The memory according to claim 1, wherein each of the plurality of memory chips comprises:
a selector, coupled to the read amplifier through a first internal input/output bus, coupled to the write amplifier through a second internal input/output bus, coupled to a shared input/output bus through a sub-shared input/output bus, and configured to select to access the first bank group or the second bank group through the read amplifier and the write amplifier.

8. The memory according to claim 7, wherein a bandwidth of the sub-shared input/output bus is greater than or equal to a sum of bandwidths of the first internal input/output bus and the second internal input/output bus, so that the read amplifier and the write amplifier simultaneously access different memory banks.

9. The memory according to claim 7, wherein a bandwidth of the shared input/output bus is equal to a sum of bandwidths of two sub-shared input/output buses.

10. The memory according to claim 1, wherein the read amplifier and the write amplifier respectively access the first bank group and the second bank group through different global data lines.

11. A memory chip, comprising:
- a first bank group, comprising a plurality of first memory banks;
- a second bank group, comprising a plurality of second memory banks; and
- a read amplifier and a write amplifier, separately coupled to the first bank group and the second bank group, and configured to independently access different bank groups,
- wherein the memory chip receives a read start command to start a reading operation, and the read amplifier reads first data from one of the first bank group and the second bank group during a reading period of the reading operation,
- wherein the memory chip successively receives a write start command during the reading period to start a writing operation, and the write amplifier of the memory chip writes second data into the one of the first bank group and the second bank group during a writing period of the writing operation, wherein the reading period and the writing period are partially overlapped.

12. The memory chip according to claim 11, wherein each of the plurality of first memory banks and the plurality of second memory banks is a memory array, and the memory array comprises:
- a plurality of sub-memory arrays, coupled to the read amplifier and the write amplifier through a global data line,
- wherein when the read amplifier reads the first data of one of the plurality of sub-memory arrays from the global data line according the read start command during the read period, and the write amplifier previously receive the second data to start the write period,
- wherein after read amplifier finishes receiving the first data from the global data line during the read period, the write amplifier successively transmits the second data to the global data line for writing into same or different sub-memory arrays during the write period.

13. The memory chip according to claim 11, further comprising:
- a selector, coupled to the read amplifier through a first internal input/output bus, coupled to the write amplifier through a second internal input/output bus, coupled to a shared input/output bus through a sub-shared input/output bus, and configured to select to access the first bank group or the second bank group through the read amplifier and the write amplifier.

14. The memory chip according to claim 13, wherein a bandwidth of the sub-shared input/output bus is greater than or equal to a sum of bandwidths of the first internal input/output bus and the second internal input/output bus, so that the read amplifier and the write amplifier simultaneously access different memory banks.

15. The memory chip according to claim 13, wherein a bandwidth of the shared input/output bus is equal to a sum of bandwidths of two sub-shared input/output buses.

16. The memory chip according to claim 11, wherein the read amplifier and the write amplifier respectively access the first bank group and the second bank group through different global data lines.

17. A memory data access method, adapted to a memory chip, wherein the memory chip comprises a first bank group, a second bank group, a read amplifier and a write amplifier, and the read amplifier and the write amplifier are configured to independently access different bank groups, wherein the data access method comprises:
- receiving, by the memory chip, a read start command to start a reading operation;
- reading, by the read amplifier, first data from one of the first bank group and the second bank group during a reading period of the reading operation;
- successively receiving, the memory chip, a write start command during the reading period to start a writing operation; and
- writing, by the write amplifier, second data into the one of the first bank group and the second bank group during a writing period of the writing operation, wherein the reading period and the writing period are partially overlapped.

18. The memory data access method according to claim 17, wherein each of the plurality of first memory banks and the plurality of second memory banks is a memory array, and the memory array comprises a plurality of sub-memory arrays coupled to the read amplifier and the write amplifier through a global data line,
- wherein when the read amplifier reads the first data of one of the plurality of sub-memory arrays from the global data line according the read start command during the read period, and the write amplifier previously receive the second data to start the write period,
- wherein after read amplifier finishes receiving the first data from the global data line during the read period, the write amplifier successively transmits the second data to the global data line for writing into same or different sub-memory arrays during the write period.

* * * * *